US008227318B2

(12) United States Patent
Levy et al.

(10) Patent No.: US 8,227,318 B2
(45) Date of Patent: Jul. 24, 2012

(54) INTEGRATION OF MULTIPLE GATE OXIDES WITH SHALLOW TRENCH ISOLATION METHODS TO MINIMIZE DIVOT FORMATION

(75) Inventors: Max Levy, Essex Junction, NY (US); Natalie Feilchenfeld, Essex Junction, NY (US); Richard Phelps, Essex Junction, NY (US); BethAnn Rainey, Essex Junction, NY (US); James Slinkman, Essex Junction, NY (US); Steven H. Voldman, Essex Junction, NY (US); Michael Zierak, Essex Junction, NY (US); Hubert Enichlmair, Graz (AT); Martin Knaipp, Unterpremstaetten (AT); Bernard Loeffler, Gleisdorf (AT); Rainer Minixhofer, Unterpremstaetten (AT); Jong-Mun Park, Graz (AT); Georg Roehrer, Graz (AT)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 12/622,028

(22) Filed: Nov. 19, 2009

(65) Prior Publication Data

US 2011/0117714 A1     May 19, 2011

(51) Int. Cl.
*H01L 21/762* (2006.01)

(52) U.S. Cl. .. 438/296; 438/437; 438/739; 257/E21.546

(58) Field of Classification Search ............... 438/296, 438/424, 437, 739; 257/E21.546
See application file for complete search history.

(56) References Cited

U.S. PATENT DOCUMENTS

| 5,733,383 | A | 3/1998 | Fazan et al. |
|---|---|---|---|
| 6,197,659 | B1 | 3/2001 | Liu |
| 6,258,673 | B1 | 7/2001 | Houlihan et al. |
| 6,670,279 | B1 | 12/2003 | Pai et al. |
| 6,727,159 | B2 | 4/2004 | Chen et al. |
| 6,806,163 | B2 * | 10/2004 | Wu et al. ............. 438/423 |
| 2005/0186741 | A1 | 8/2005 | Roizin et al. |
| 2006/0252188 | A1 | 11/2006 | Verma et al. |
| 2006/0281251 | A1 | 12/2006 | Chen et al. |
| 2006/0289947 | A1 | 12/2006 | Yamanaka |
| 2007/0128804 | A1 | 6/2007 | Jin et al. |

* cited by examiner

*Primary Examiner* — Zandra Smith
*Assistant Examiner* — Toniae Thomas
(74) *Attorney, Agent, or Firm* — Scully, Scott, Murphy & Presser, P.C.; David Cain (57) ABSTRACT

A method of forming an isolation region is provided that in one embodiment substantially reduces divot formation. In one embodiment, the method includes providing a semiconductor substrate, forming a first pad dielectric layer on an upper surface of the semiconductor substrate and forming a trench through the first pad dielectric layer into the semiconductor substrate. In a following process sequence, the first pad dielectric layer is laterally etched to expose an upper surface of the semiconductor substrate that is adjacent the trench, and the trench is filled with a trench dielectric material, wherein the trench dielectric material extends atop the upper surface of the semiconductor substrate adjacent the trench and abuts the pad dielectric layer.

10 Claims, 9 Drawing Sheets

INTEGRATION OF MULTIPLE GATE OXIDES WITH SHALLOW TRENCH ISOLATION METHODS TO MINIMIZE DIVOT FORMATION

FIELD OF THE INVENTION

The present disclosure generally relates to microelectronics. In one embodiment, the present invention relates to a method of reducing divot formation in producing shallow trench isolation (STI) regions.

BACKGROUND

As semiconductor device dimensions are decreased, and device density increases, it becomes more difficult to efficiently and reliably fabricate isolation structures for separating active areas of the device. One common method of forming isolation structures for semiconductor devices is referred to as localized oxidation of silicon (LOCOS). However, the limits of the standard LOCOS process have motivated the development of new isolation processes.

Shallow trench isolation (STI) has become the most common and important isolation technology for sub-quarter micron complementary metal oxide semiconductor (CMOS) devices. Conventional STI processes include corner rounding and divot formation (i.e., oxide recess) along STI edges. In some scenarios, the divot at the edge of the STI is formed due to wet dip of a pad oxide by an HF solution.

SUMMARY

A method of forming an isolation region is provided that in one embodiment includes forming a first pad dielectric layer on an upper surface of a semiconductor substrate; forming a trench through the first pad dielectric layer into the semiconductor substrate; laterally etching the first pad dielectric layer to expose the upper surface of the semiconductor substrate adjacent the trench; filling the trench with a trench dielectric material, wherein the trench dielectric material extends atop the upper surface of the substrate adjacent the trench and abuts the pad dielectric layer; removing the first pad dielectric layer to provide an exposed portion of the upper surface of the substrate that is adjacent the trench dielectric material that extends atop the upper surface of the semiconductor substrate; and forming a conformal dielectric layer overlying the exposed portion of the semiconductor substrate and the trench dielectric material.

In another aspect, the method includes providing a forming a pad stack on an upper surface of a semiconductor substrate, the pad stack including a second pad dielectric layer atop the semiconductor substrate and a first pad dielectric layer atop the second pad dielectric layer; forming at least a first trench and a second trench through the pad stack into the semiconductor substrate; forming an etch mask dielectric layer on a base and sidewall of the first trench and a portion of the pad stack adjacent to the first trench; etching the pad stack using the etch mask dielectric layer as an etch mask to provide an exposed portion of the upper surface of the semiconductor substrate that is adjacent to the second trench in which the etch mask dielectic layer is not present; and filling the first trench and the second trench with a trench dielectric material, wherein a portion of the trench dielectric material is present on the exposed portion of the upper surface of the semiconductor substrate.

In another aspect of the present invention, divot reduction in isolation region formation may be realized by a process in which a thermal oxide layer having a thickness on the order of 40 nm or greater is formed prior to etch processes that define the active device region of the substrate. In one embodiment, this aspect includes thermally growing an oxide pad dielectric layer on a semiconductor substrate, wherein the oxide pad dielectric layer has a thickness greater than 40 nm; patterning the oxide pad dielectric layer to provide a via to an exposed surface of the semiconductor substrate that is overlying at least a portion of the active device region of the semiconductor substrate; forming a gate dielectric on the exposed surface of the semiconductor substrate; and forming a trench isolation region extending through the oxide pad dielectric into a portion of the semiconductor substrate that is abutting the active device region of the semiconductor substrate.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

The present invention in at least one embodiment provides methods of forming isolation regions, such as shallow trench isolation (STI) regions, without forming divots at the interface of the dielectric material and the semiconductor material.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

When describing the methods and structures of the present invention, the following terms have the following meanings, unless otherwise indicated.

As used herein, the term "dielectric" denotes a non-metallic material having insulating properties.

As used herein, the terms "insulating" and "electrically insulates" denote a room temperature conductivity of less than $10^{-10}$ $(\Omega m)^{-1}$.

As used herein, the term "divot" denotes a recess that is present at the interface of an isolation region and a semiconductor layer that extends from an exterior surface of the interface between the semiconductor layer and the isolation region to an interior depth.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "atop" or "over" or "overlying" or "below" or "underlying" another element, it can be directly on the other element or intervening elements may also be present. In contrast, when an element is referred to as being "directly on" or "directly over" or in "direct physical contact" with another element, there are no intervening elements present.

FIGS. 1-8 depict one embodiment of a method of fanning an isolation region 100, such as a shallow trench isolation region (STI), between active regions, in which divot formation is substantially reduced by laterally etching a pad dielectric layer 10 that is present overlying a portion of the semiconductor substrate 5 that is adjacent to the trench 15, in which the trench 15 of the isolation region 100 is formed prior to dielectric fill of the trench 15. In one example, the method may begin with providing a semiconductor substrate 5 and forming a pad dielectric layer 10 onto an upper surface of the semiconductor substrate 5. In a following process step, a trench 15 is then formed through the pad dielectric layer 10 into the semiconductor substrate 5. Thereafter, the pad dielectric layer 10 is laterally etched to expose an upper surface 20 of the semiconductor substrate 5 adjacent the trench 15. The trench 15 is then filled with a trench dielectric material 25, wherein the trench dielectric material 25 extends atop the upper surface 20 of the semiconductor substrate 5 adjacent the trench 15 that abuts the pad dielectric layer 10. In a following sequence, the pad dielectric layer 10 is removed to provide an exposed portion 30 of the upper surface of the semiconductor substrate 5 that is adjacent the trench dielectric material 25 that extends atop the upper surface 20 of the semiconductor substrate 5 and a conformal dielectric layer 35 is formed overlying the exposed portion of the semiconductor substrate 5 and the trench dielectric material 25. The details of the above described methods and structures are now discussed in greater detail.

Figure 1:
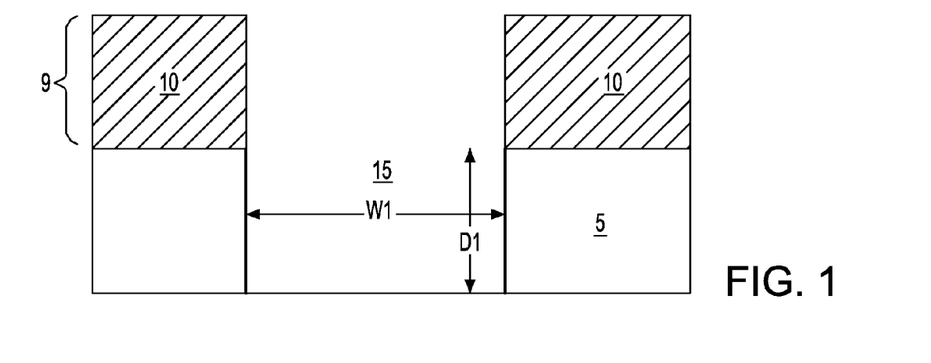
FIG. 1 is a side cross-sectional view of one embodiment of an initial structure for a method of reducing divot formation in shallow trench isolation (STI) regions, in which the initial structure includes a pad stack having at least one pad dielectric layer atop a substrate through which a trench has been formed, as used in accordance with the present invention.

FIG. 1 depicts one embodiment of an initial structure for a method of reducing divot formation in shallow trench isolation (STI) regions, in which the initial structure may include a pad stack 9 having at least one pad dielectric layer 10 atop a semiconductor substrate 5, wherein a trench 15 is formed through the pad stack 9, e.g., through the pad dielectric layer 10, into the semiconductor substrate 5.

In one embodiment, the semiconductor substrate 5 employed in the present invention may be any semiconducting material including, but not limited to Si, Ge, SiGe, SiC, SiGeC, Ga, GaAs, InAs, InP and all other III/V or II/VI compound semiconductors. The semiconductor substrate 5 may also include an organic semiconductor or a layered semiconductor, such as Si/SiGe, a silicon-on-insulator (SOI) or a SiGe-on-insulator (SGOI). In some embodiments of the present invention, the semiconductor substrate 5 is composed of a Si-containing semiconductor material, i.e., a semiconductor material that includes silicon. The semiconductor substrate 5 may be doped, undoped or contain doped and undoped regions therein. The semiconductor substrate 5 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells".

In one embodiment, the pad dielectric layer 10 is composed of a nitride material. One example of a nitride material suitable for use as the pad dielectric layer 10 is silicon nitride. In another embodiment, the pad dielectric layer 10 may be an oxide, such as tetraethyl orthosilicate (TEOS), CVD-oxide, or borophosphosilicate glass (BPSG), or a combination of oxide and nitride layers. It is noted that other compositions for the pad dielectric layer 10 have also been contemplated, so long as, the composition selected provides a degree of etch selectivity relative to the underlying materials.

In one embodiment, the pad dieletric layer 10 can be formed using deposition processes, such as chemical vapor deposition, plasma enhanced chemical vapor deposition, atomic layer deposition and chemical deposition. Alternatively, the pad dielectric layer 10 may be grown, e.g., using thermal oxidation and/or nitridation. In one embodiment, the pad dielectric layer 10 can have a thickness ranging from 10 nm to 500 nm. In another embodiment, the pad dielectric layer 10 may have a thickness ranging from 20 nm to 100 nm.

Further, in some embodiments, a second pad dielectric layer (not shown) may be present between the pad dielectric layer 10 and the semiconductor substrate 5. In the embodiments in which the pad dielectric layer 10, i.e., first pad dielectric layer of the pad stack 9, is composed of a nitride, the second pad dielectric layer is composed of an oxide, such as silicon oxide. In one embodiment, the second pad dielectric layer can have a thickness ranging from 5 nm to 15 nm. In another embodiment, the second dielectric layer can have a thickness of 10 nm or less. It is noted that the pad stack 9 has been contemplated to include any number of dielectric layers and it is not intended that the present invention be limited to pad stack 9 described above.

The trench 15 may be formed by an etch process that etches through the pad stack 9 into the semiconductor substrate 5. In one embodiment, following the formation of the pad stack 9, a mask (not shown) is formed on a predetermined portion of the pad stack 9, so as to protect a portion of the pad stack, while leaving another portion of the pad stack 9 that is overlying the subsequently formed trench 15 unprotected. The mask may be formed by applying a photoresist layer (not shown) to the entire surface of pad stack 9, wherein after application of the photoresist layer, the mask is patterned by lithography, which includes the steps of exposing the photoresist to a pattern of radiation and developing the pattern utilizing a resist developer. After providing the mask, the structure is subjected to one or more etching steps so as to define the trench 15 within the semiconductor substrate 5. The etching may include a dry etching process, such as reactive-ion etching, ion beam etching, plasma etching or laser etching. In one embodiment, using a photoresist and masking process as described above allows for multiple sizes of trench to be formed on the same wafer.

In one embodiment, the width W1 of the trench 15 ranges from 50 nm to 10 µm. In another embodiment, the width W1 of the trench 15 ranges from 70 nm to 500 µm. In an even further embodiment, the width W1 of the trench 15 ranges from 70 nm to 200 nm.

In one embodiment, the depth D1 of the trench 15 ranges from 50 nm to 10 µm, as measured from the upper surface of the semiconductor substrate 5. In another embodiment, the depth D1 of the trench 15 ranges from 70 nm to 500 nm. In an even further embodiment, the depth D1 of the trench 15 ranges from 70 nm to 200 nm.

Following etching, the mask may be removed with a chemical clean or by oxygen ashing. The resultant structure after the etching process has been performed is shown, for example, in FIG. 1.

Figure 2:
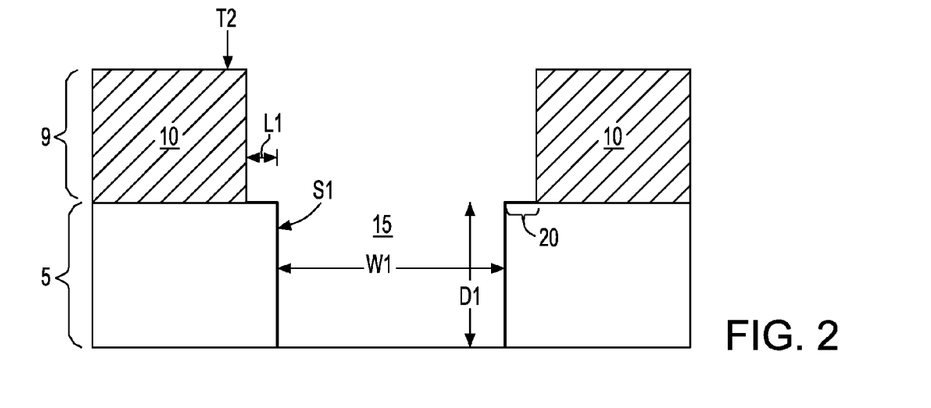
FIG. 2 is a side cross-sectional view of laterally etching the pad dielectric layer to expose an upper surface of the semiconductor substrate adjacent the trench, as used in accordance with the present invention.

FIG. 2 depicts laterally etching the dielectric stack 9 to expose an upper surface 20 of the semiconductor substrate 5 adjacent the trench 15. In one embodiment, the step of laterally etching removes a portion of the pad dielectric layer 10 that extends a dimension L1 ranging from 25 nm to 100 nm, as measured from a sidewall S1 of the trench 15. In another embodiment, the portion of the pad dielectric layer 10 that is removed has a dimension L1 that ranges from 40 nm to 80 nm. In an even further embodiment, the portion of the pad dielectric layer 10 that is removed has a dimension L1 that ranges from 60 nm to 70 nm.

In one embodiment, the step of laterally etching the pad dielectric layer 10 to expose the upper surface 20 of the semiconductor substrate 5 that is adjacent to the trench 15 includes a wet etchant appropriate for removing the dielectric material of the pad dielectric layer 10. In one example, in which the pad dielectric layer 10 is composed of a nitride material, such as silicon nitride, the laterally etching of the pad dielectric layer 10 may be conducted using a nitride etch process. The nitride etch is achieved with a combination of hydrofluoric acid (HF) and phosphoric acid. In one example, an etch chemistry for selectively etching silicon nitride includes isotropic wet etches of phosphoric acid ($H_3PO_4$) and hydrofluoric acid, which are selective with respect to silicon oxide, organic polymers, polysilicon, silicon, and metals. In one embodiment, these etches are effected by immersing the wafer in an aqueous solution of HF or $H_3PO_4$ at temperatures of 80° C. or more. In some embodiments of the invention, in which the etch chemistry includes hydrofluoric acid, the etch temperature is on the order of 100° C. or more. In embodiments of the invention, in which the etch chemistry includes phosphoric acid etches, the etch temperature may be on the order of 100° C. or more, and in some examples greater than 180° C.

In some examples, when performing a phosphoric acid etch, it is desirable to maintain the concentration of etchant in solution with reflux. Refluxed, boiling phosphoric acid at 180° C. has been found in some instances to provide an etch rate of up to 100 Å per minute for silicon nitride films. Deposited silicon dioxide has an etch rate of about 10 Å per minute, and in some instances deposited silicon dioxide may have an etch rate ranging from 0 Å per minute to 25 Å per minute depending upon temperature and preparation. Elemental silicon has an etch rate of about 3 Å per minute. For temperatures ranging from 140-200° C., etch rates increase with temperature.

Water content of the phosphoric acid plays an important role in etching of silicon nitride and silicon dioxide. At a constant temperature, addition of water increases the etch rate of silicon nitride and decreases the etch rate of silicon dioxide.

Because the nitride etch removes nitride from all directions, the pad dielectric layer 10 is thinned by the nitride etch. In one embodiment, the pad dielectric layer 10 is thinned by a dimension T2 ranging from 10 nm to 70 nm, as measured from an upper surface of the pad dielectric layer 10. In another embodiment, the pad dielectric layer 10 is thinned by a dimension T2 ranging from 10 nm to 70 nm.

Figure 3:
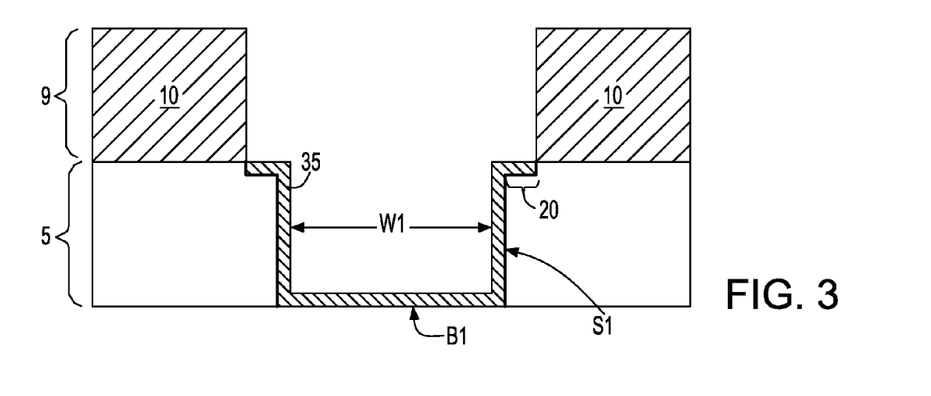
FIG. 3 is a side cross-sectional view of forming a thermally grown oxide liner on the trench sidewalls and base, as used in accordance with the present invention.

Referring to FIG. 3, and in one embodiment, prior to filling the trench 15 with the trench dielectric material 25, a conformal dielectric layer 35 is formed on the upper surface of the semiconductor substrate 5 that is adjacent to the trench 15 and the sidewalls S1 and base B1 of the trench 15. The conformal dielectric layer 35 may be an oxide, such as silicon oxide. In one embodiment, the conformal dielectric layer 35 has a thickness ranging from 1 nm to 10 nm, which in some examples can range from 2 nm to 5 nm. In one embodiment, the conformal dielectric layer 35 is formed using a growth process, such as thermal oxidation, or the conformal dielectric layer 35 is formed using a deposition method, such as CVD. In one embodiment, the conformal dielectric layer 35 is composed of a thermally grown oxide.

Figure 4:
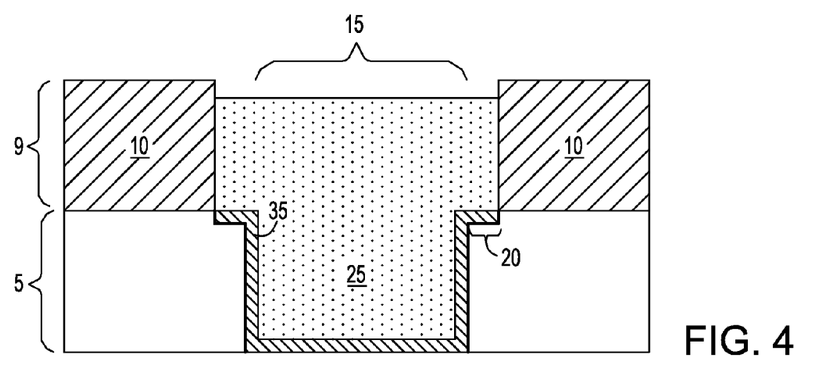
FIG. 4 is a side cross-sectional view of filling the trench with a trench dielectric material, wherein the trench dielectric layer extends atop the upper surface of the semiconductor substrate adjacent the trench and abuts the pad dielectric layer followed by a planarization step of the trench dielectric, in accordance with the present invention.

FIG. 4 depicts a process sequence that includes filling the trench 15 with a trench dielectric material 25, wherein the trench dielectric material 25 extends atop the upper surface 20 of the semiconductor substrate 5 adjacent the trench 15 and abutts the pad dielectric layer 10, and a planarization step. In one embodiment, the trench dielectric material 25 is composed of a dielectric material, such as an oxide, polysilicon or combinations thereof. In one embodiment, the trench dielectric material 25 is deposited to fill the trench 15 using chemical vapor deposition (CVD) or another like deposition process. "Chemical Vapor Deposition" is a deposition process in which a deposited species is formed as a results of chemical reaction between gaseous reactants at greater than room temperature (25° C. to 600° C.), wherein solid product of the reaction is deposited on the surface on which a film, coating, or layer of the solid product is to be formed. The trench dielectric material 25 may optionally be densified after deposition. In one embodiment, the trench dielectric material 25 may be composed of high density plasma (HDP) chemical vapor deposition (CVD) deposited silicon oxide. HDPCVD is a chemical vapor deposition process that utilizes a low pressure (2-10-mTorr range) to achieve a high electron density ($10^{10}$ cm$^3$-$10^{12}$ cm$^3$) and a high fractional ionization rate ($10^{-4}$ to $10^{-1}$) for deposition.

The planarization process may be used to provide a planar structure, in which the upper surface of the trench dielectric material 25 within the trench is coplanar with the pad dielectric layer 10. As used herein, "planarization" is a material removal process that employs at least mechanical forces, such as frictional media, to produce a planar surface. One example of a planarization process is chemical mechanical planarization (CMP). "Chemical mechanical planarization" is a material removal process using both chemical reactions and mechanical forces to remove material and planarize a surface.

Figure 5:
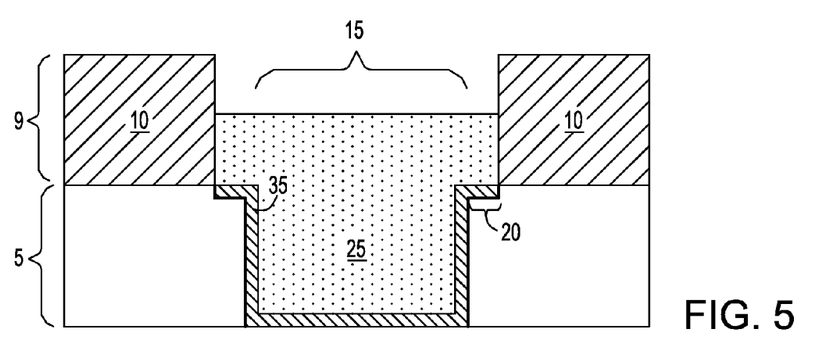
FIG. 5 is a side cross-sectional view of one embodiment of a wet etch and clean process applied to the trench dielectric material that is present in the trench, in accordance with the present invention.

In one embodiment, following the filling of the trench 15 with the trench dielectric material 25 and planarization, an upper surface of the trench dielectric material 25 is treated with a etch process that includes a hydrofluoric (HF) acid composition. This process step may recess the upper surface of the trench dielectric material 25 below the upper surface of the pad dielectric layer 10. For example, the upper surface of the trench dielectric material 25 may be recessed 2 nm to 5 nm from the upper surface of the pad dielectric layer 10 by the etch process, as depicted in FIG. 5. In one example, in which the trench dielectric material 25 is an oxide, such as silicon oxide, the etch process includes either a wet or plasma etch. As an example, a 4.9 mole % solution of HF in water for a duration in the order of 20 seconds may be used.

Figure 6:
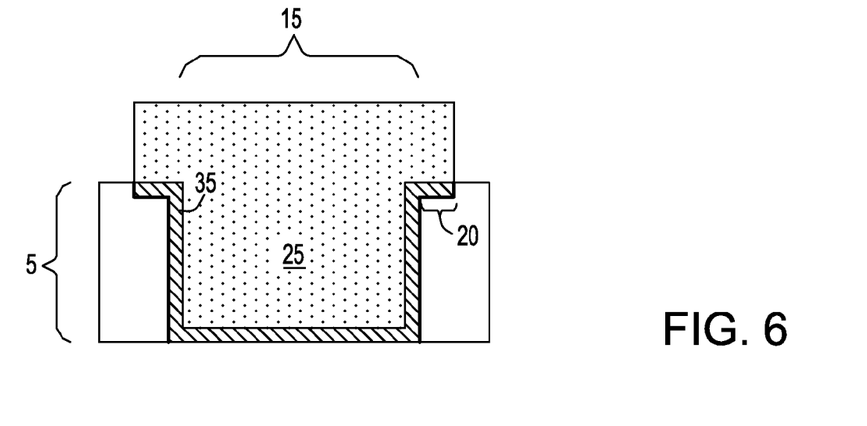
FIG. 6 is a side cross-sectional view depicting removing the pad dielectric layer, as used in accordance with one embodiment of the present invention.

FIG. 6 depicts one embodiment of removing of the pad dielectric layer 10 to provide an exposed portion 30 of the upper surface of the semiconductor substrate 5. This removing step may include a selective etch process. As used herein, the term "selective" in reference to a material removal process denotes that the rate of material removal for a first material is greater than the rate of removal for at least another material of the structure to which the material removal process is being applied. In one embodiment, when the second pad dielectric (not shown) is present between the pad dielectric layer 10, i.e., first pad dielectric layer 10, and the semiconductor substrate 5, the step of removing of the first pad dielectric layer 10 includes a selective etch that removes the first pad dielectric layer 10 selective to the second pad dielectric layer and the dielectric material within the trench, wherein in a following etch process the second pad dielectric layer is removed selective to the semiconductor substrate 5.

Figure 7:
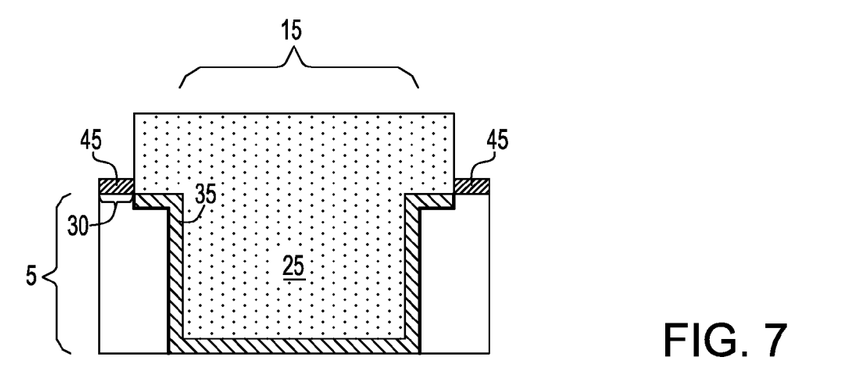
FIG. 7 is a side cross-sectional view of forming a gate dielectric, in accordance with one embodiment of the present invention.

FIG. 7 depicts forming a first gate dielectric 45 overlying the exposed portion 30 of the upper surface of the semiconductor substrate 5. The first gate dielectric 45 may be composed of an oxide material, such as silicon oxide. In one embodiment, the first gate dielectric 45 is formed by a growth process, such as thermal oxidation. Alternatively, the first gate dielectric 45 is formed using a deposition process, such as chemical vapor deposition, that may be used in conjunction with an etch process to dictate where the first gate dielectric 45 is present. The first gate dielectric 45 may have a thickness ranging from 1 nm to 10 nm, wherein in one embodiment, the first gate dielectric has a thickness ranging from 2 nm to 5 nm. In the embodiments of the invention, in which the first gate dielectric 45 is produced by a thermal growth process, such as thermal oxidation, the first gate dielectric 45 is only formed atop semiconductor surfaces, such as the Si-containing substrate.

Figure 8:
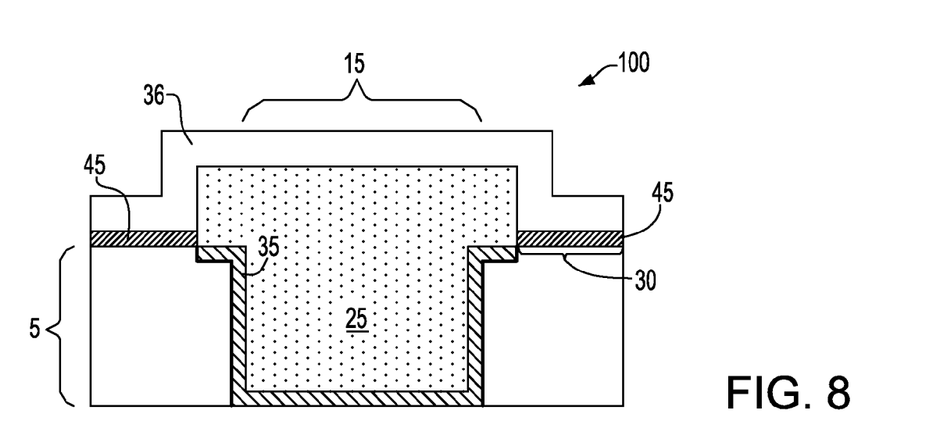
FIG. 8 is a side cross-sectional view of forming a conformal dielectric layer over the semiconductor substrate and the trench dielectric material that is present in the trench, in accordance with one embodiment of the present invention.

Referring to FIG. 8 and in one embodiment, following the formation of the first gate dielectric 45, a second dielectric layer 36 is then formed atop the structure depicted in FIG. 7. The second dielectric layer 36 that is formed overlying the exposed portion 30 of the semiconductor substrate 5, which may include the first gate dielectric 45 thereon, and overlying the trench dielectric material 25 that is present in the trench 15, may include an oxide or dielectric material deposited by chemical vapor deposition, such as plasma enchanced chemical vapor deposition. In one embodiment, the second dielectric layer 36 is a conformal layer. As used herein, a conformal layer is a deposited material having a thickness that remains the same regardless of the geometry of underlying features on which the layer is deposited.

The second dielectric layer 36 that is formed atop the semiconductor substrate 5, may be an oxide material that may range from 2.5 nm to 5.0 nm thick. The second dielectric layer 36 is formed using conventional techniques, such as chemical vapor deposition (CVD), atomic layer CVD (ALCVD), pulsed CVD, plasma of photo assisted CVD, sputtering, and chemical solution deposition, or alternatively, the second dielectric layer 36 is formed by thermal growing process, which may include oxidation, oxynitridation, nitridation, and/or plasma or radical treatment. Suitable examples of oxides that can be employed as conformal dielectric layer 35 include, but are not limited to $SiO_2$, $Al_2O_3$, $ZrO_2$, $HfO_2$, $Ta_2O_3$, $TiO_2$, perovskite-type oxides and combinations and multi-layers thereof. It is noted that the second dielectric layer 36 may also be composed of a high-k dielectric material, wherein high-k dielectric materials have a dielectric constant of 3.9 or greater, typically on the order of 4.0, and in some instances greater than 7.0.

Following the formation of the second dielectric layer 36, the structure may then be processed to provide a microelectronic structure wherein the isolation region 100 provides for electrical isolation between adjacent devices, such as semiconductor devices, or components. In one embodiment, the laterally etching of the pad dielectric layer 10, i.e., an extended nitride etch, e.g., nitride pull back process, that exposed the portion of upper surface 20 of the semiconductor substrate 5 having a length L1 ranging from 10 nm to 70 nm that is extending from and adjacent to the trench 15, substantially reduces divot formation at the interface of the semiconductor substrate 5 and the trench dielectric material 25 within the trench 15.

Prior to the present discovery, isolation region formation that did not include the above process sequence resulted in a recess, i.e., divot, at the interface of the trench dielectric material that filled the trench of the isolation region and the semiconductor substrate material in which the trench was formed. It has been determined that divot formation disadvantageously reduces device performance. In one example, in which the divots have been eliminated, the threshold voltage can be differentiated by a value up to 50% of the threshold voltage when compared to similar devices in which divots are not present. Further, the reliability of the gate dielectric, e.g., gate oxide, can be reduced by gate thinning by the wet etch steps that result in divot formation. In addition to reducing divot formation in low voltage devices, e.g., semiconductor devices having a gate oxide thickness below 200 Å, the present invention also increases electrical isolation of high voltage devices, in which the gate oxide thickness is greater than 200 Å, by extending the dielectric material, i.e., trench dielectric material 25, atop the portion of the semiconductor substrate 5 that is exposed by the laterally etching of the pad dielectric layer 10.

FIGS. 9-15 depict another embodiment of the present invention, in which a method of forming isolation regions 100a, 100b is provided that substantially reduce divot formation in selected regions of semiconductor substrate 5 by laterally etching a pad dielectric layer that is utilized to form the trench region of the isolation regions prior to filling the trenches with dielectric material that provides the isolation regions. In one embodiment, the method may begin with a process sequence that includes providing a semiconductor substrate 5 and forming a pad stack 9 on an upper surface of the semiconductor substrate 5. The pad stack 9 may include a second pad dielectric layer 11 atop the semiconductor substrate 5 and a first pad dielectric layer 10 atop the second pad dielectric layer 11. In a following process step, at least a first trench 15a and at least a second trench 15b are formed through the pad stack 9 into the semiconductor substrate 5. Thereafter, an etch mask dielectric layer 65b is formed on a base $B_1$ and sidewall $S_1$ of the first trench 15a and a portion 60 of the pad stack 9 adjacent the first trench 15a. The pad stack 9 is then etched using the etch mask dielectric layer 65b as an etch mask to provide an exposed portion 30 of the upper surface of the semiconductor substrate 5 that is adjacent to the second trench 15b in which the etch mask dielectic layer 65b is not present. Thereafter, the first trench 15a and the second trench 15b are filled with a trench dielectric material 25, wherein a portion of the trench dielectric material 25 is present on the exposed portion 30 of the upper surface of the semiconductor substrate 5. The details of the above described methods and structures are now discussed in greater detail.

Figure 9:
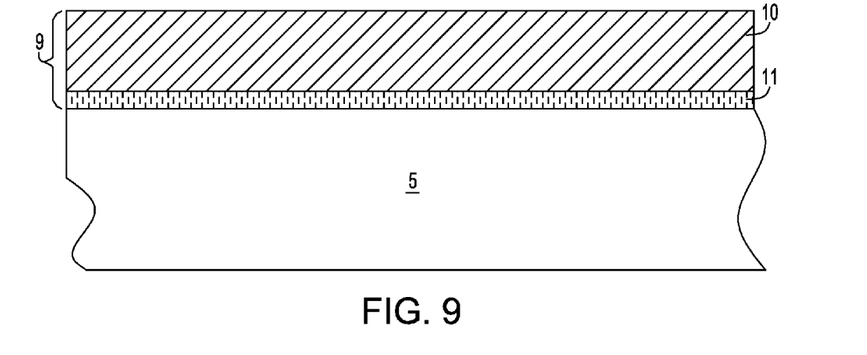
FIG. 9 is a side cross sectional view of one embodiment of an initial structure for a method of reducing divot formation in shallow trench isolation (STI) regions in selected regions of a semiconductor substrate, in which the initial structure includes a pad stack having at least a second pad dielectric layer atop a semiconductor substrate and a first pad dielectric layer overlying the second pad dielectric layer, as used in accordance with the present invention.

Referring to FIG. 9, and in one embodiment, an initial structure for a method of reducing divot formation in shallow trench isolation (STI) regions in selected regions of a semiconductor substrate 5 includes a pad stack 9 having at least a second pad dielectric layer 11 atop a semiconductor substrate 5 and a first pad dielectric layer 10 overlying the second pad dielectric layer 11. It is noted that the semiconductor substrate 5 that is described above in connection with the embodiments of the invention including the initial structure depicted in FIG. 1 is equally applicable to the semiconductor substrate 5 described in the embodiments of the invention that are illustrated in FIGS. 9-15. It is further noted the description of the materials and methods of formation for the pad dielectric layer 10 that are described above in FIG. 1 are suitable to describe the first pad dielectric 10 that is illustrated in FIGS. 9-15. Additionally, the second pad dielectric that is described with reference to FIG. 1 is suitable to meet the requirements of the second pad dielectric layer 11 that is described in the embodiments of the invention that are illustrated in FIGS. 9-15.

Figure 10:
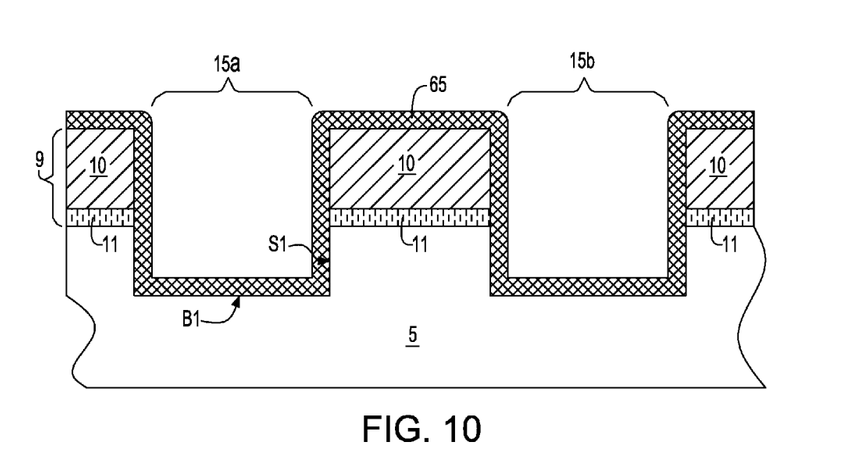
FIGS. 10-12 are side cross sectional views depicting forming at least a first trench and a second trench through the pad stack into the semiconductor substrate, and forming a conformal dielectric layer on a base and sidewall of the first trench and a portion of the pad dielectric stack adjacent the first trench, in accordance with one embodiment of the present invention.

FIG. 10 depicts forming at least a first trench 15a and a second trench 15b through the pad stack 9 into the semiconductor substrate 5. The first trench 15a and the second trench 15b may be formed utilizing deposition, photolithography and etch processes. The first trench 15a and the second trench 15b may be formed by an etch process that etches through the pad stack 9 into the semiconductor substrate 5. Similar to the description of the etch process that produces the trench 15 described in FIG. 1, the first trench 15a and the second trench 15b may be formed by applying a mask (not shown) on a predetermined portion of the pad stack 9, so as to protect a portion of the pad stack 9, while leaving another portion of the pad stack 9 that is overlying the subsequently formed first trench 15a and the second trench 15b unprotected. The mask may be formed by applying a photoresist layer (not shown) to the entire surface of pad stack 9, wherein after application of the photoresist layer, the mask is patterned by lithography, which includes the steps of exposing the photoresist to a pattern of radiation and developing the pattern utilizing a resist developer. After providing the mask, the structure is subjected to one or more etching steps so as to define the first trench 15a and the second trench 15b within the semiconductor substrate 5. The etching may include a dry etching process, such as reactive-ion etching, ion beam etching, plasma etching or laser etching.

Figure 11:
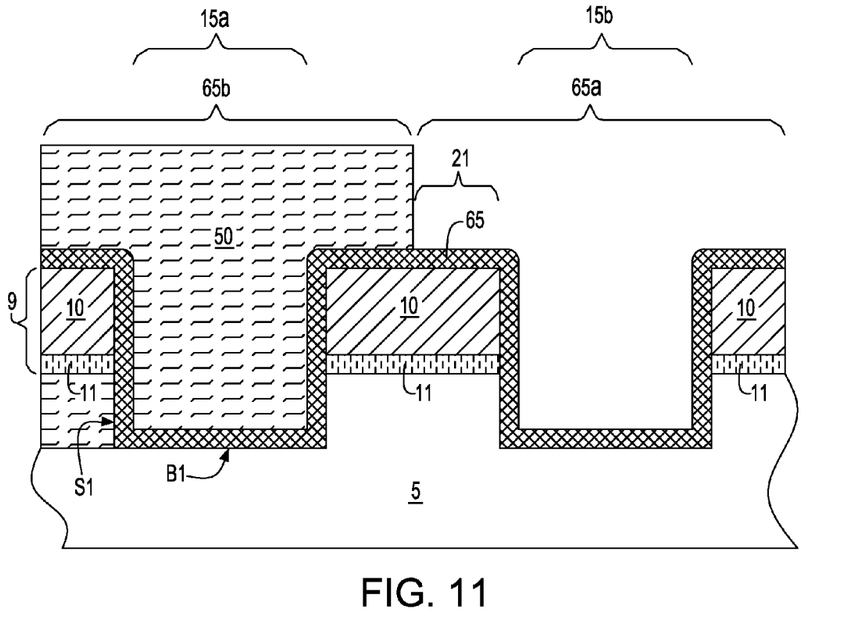
Figure 12:
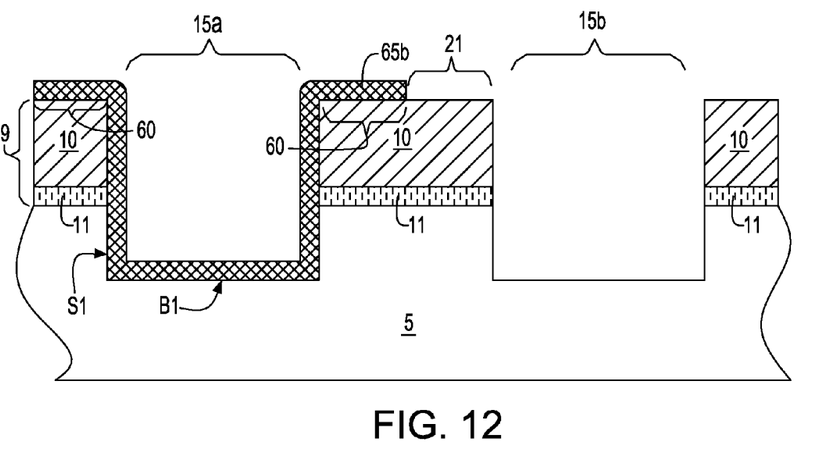

FIGS. 10, 11 and 12 depict forming an etch mask dielectric layer 65 on a base B1 and sidewall S1 of the first trench 15a and a portion 60 of the upper surface of the dielectric stack 9 that is adjacent the first trench 15a. The etch mask dielectric layer 65 may include an oxide deposited by chemical vapor deposition (CVD), such as plasma enhanced chemical vapor deposition. In one embodiment, the etch mask dielectric layer 65 is a conformal layer.

The etch mask dielectric layer 65 may be an oxide material that typically range from 2.5 nm to 5.0 nm thick. The etch mask dielectric layer 65 may be formed using deposition techniques, such as chemical vapor deposition (CVD), atomic layer CVD (ALCVD), pulsed CVD, plasma of photo assisted CVD, sputtering, and chemical solution deposition, or alternatively, the etch mask dielectric layer 65 is formed by thermal growing process, which may include oxidation, oxynitridation, nitridation, and/or plasma or radical treatment. Suitable examples of oxides that can be employed as the etch mask dielectric layer 65 include, but are not limited to: $SiO_2$, $Al_2O_3$, $ZrO_2$, $HfO_2$, $Ta_2O_3$, $TiO_2$, perovskite-type oxides and combinations and multi-layers thereof.

In one example, following blanket deposition of the etch mask dielectric layer 65, which is shown in FIG. 10, a portion of the etch mask dielectric layer 65 is removed so that a remaining portion of the etch mask dielectric layer 65 is present on a base B1 and sidewall S1 of the first trench 15*a* and is present on a portion 60 of the upper surface of the dielectric stack 9 that is adjacent the first trench 15*a*, in which a remaining portion of the dielectric stack 9 and the second trench 15*b* is exposed. In one embodiment, as illustrated in FIG. 11, a portion of the etch mask dielectric layer 65 is removed using deposition, photolithography, and etch processes. For example, a photoresist mask 50 may be formed overlying the portion 65*b* of the etch mask dielectric layer 65 that overlying the first trench 15*a*, wherein the portion 65*b* of the etch mask dielectric layer 65 that is overlying the second trench 15*b* and the portion 21 of the pad stack 9 adjacent to the second trench 15*b* is exposed. See FIG. 11. In one embodiment, the photoresist mask 50 is provided by blanket depositing a photoresist layer atop the structure depicted in FIG. 10, wherein after application of the photoresist layer, the photoresist mask 50 is patterned by lithography, which includes the steps of exposing the photoresist layer to patterned radiation and developing the pattern utilizing a resist developer to provide the structure depicted in FIG. 11. It is noted that any dielectric material, e.g., oxide, nitride or oxynitride, may be substituted for the photoresist material of the photoresist mask, so long as the dielectric material allows for selective etching of the etch mask dielectric layer 65. In one embodiment, after providing the photoresist mask 50, the structure is subjected to one or more etching steps so as to remove the exposed portion of the etch mask dielectric layer 65, as depicted in FIG. 12. The etching may include a dry etching process, such as reactive-ion etching, ion beam etching, plasma etching or laser etching.

Figure 13:
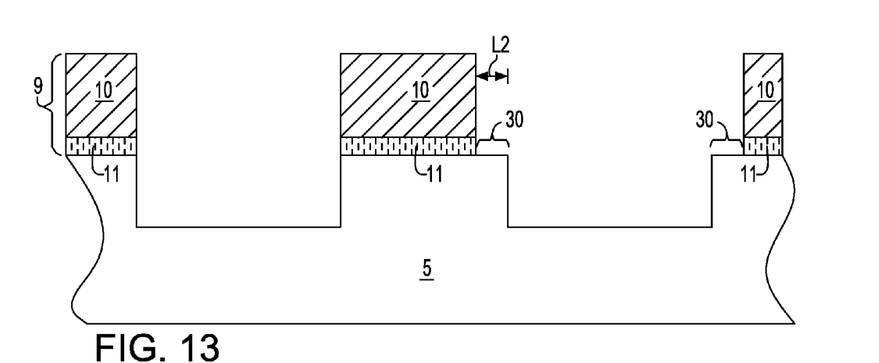
FIG. 13 is a side cross sectional view depicting etching the pad stack using the conformal dielectric layer as an etch mask to provide an exposed portion of the upper surface of the substrate that is adjacent to the second trench in which the conformal dielectic is not present, in accordance with one embodiment of the present invention.

FIGS. 12 and 13 depict one embodiment of etching the exposed portion of the pad stack 9 using the remaining portion of the etch mask dielectric layer 65*b* as an etch mask to provide an exposed portion 30 of the upper surface of the semiconductor substrate 5 that is adjacent to the second trench 15*b*. In one embodiment, in which the pad stack 9 is composed of a first pad dielectric layer 10 that is composed of a nitride, such as silicon nitride, and a second pad dielectric layer that is composed of an oxide, such as silicon oxide, and the etch mask dielectric layer 65*b* is composed of an oxide, such as silicon oxide, the step of etching the exposed portion 21 of the pad stack 9 may include a multi-step selective etch process. In one example, a first etch process removes the exposed portion of the first pad dielectric layer 10, e.g., a first pad dielectric layer 10 composed of silicon nitride, selective to the etch mask dielectric layer 65*b*, e.g., etch mask dielectric layer 65*b* composed of silicon oxide, wherein the etch chemistry may be composed of hydrofluoric acid or phosphoric acid. Thereafter, a second etch process removes the exposed portion of second pad dielectric layer 11, e.g., a second pad dielectric layer 11 composed of silicon oxide, selective to the first pad dielectric layer 10, e.g., first pad dielectric layer 10 composed of silicon nitride, and the semiconductor substrate 5, wherein the etch chemistry may be composed of hydrofluoric acid or phosphoric acid. In one embodiment, the etch process that removes the exposed portion of the second pad dielectric layer 11 removes the remaining portion of the etch mask dielectric layer 65*b*.

The etch process described above exposes a portion 30 of the upper surface of the semiconductor substrate 5 that is adjacent to the second trench 15*b*. In one embodiment, the exposed portion 30 of the upper surface of the semiconductor substrate 5 has a length L2 ranging from 10 nm to 70 nm, as measured from the sidewall S1 of the second trench 15*b*. In another embodiment, the exposed portion 30 of the upper surface of the semiconductor substrate 5 has a length L2 ranging from 20 nm to 60 nm. In an even further embodiment, the exposed portion 30 of the upper surface of the semiconductor substrate 5 has a length L2 ranging from 30 nm to 40 nm, as measured from the sidewall S1 of the second trench 15*b*.

Figure 14:
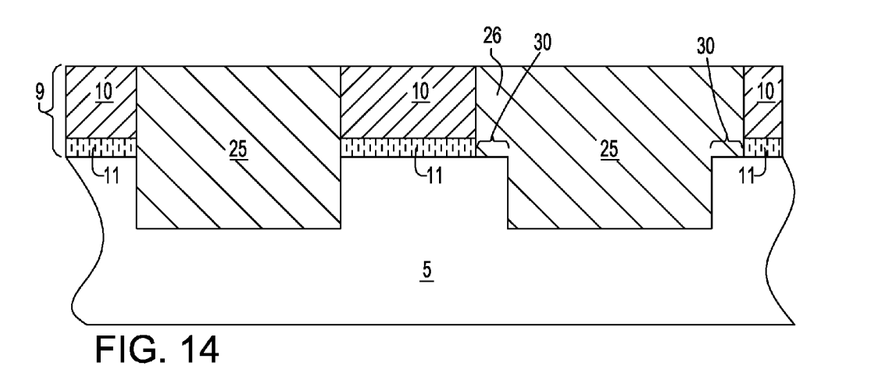
FIG. 14 is a side cross sectional view depicting one embodiment of filling the first trench and the second trench with a trench dielectric material, wherein a portion of the trench dielectric material is present on the exposed portion of the upper surface of the substrate, in accordance with the present invention.

FIG. 14 depicts one embodiment of filling the first trench 15*a* and the second trench 15*b* with a trench dielectric material 25, wherein a portion 26 of the trench dielectric material 25 is present on the exposed portion 30 of the upper surface of the semiconductor substrate 5. In one embodiment, prior to filling the first trench 15*a* and the second trench 15*b* with the trench dielectric material 25, a dielectric liner (not shown) is formed on at least the sidewalls S1 and base 131 of the first trench 15*a* and the second trench 15*b*. The dielectric liner may be an oxide, such as silicon oxide. In one embodiment, the dielectric liner may have a thickness ranging from 1 nm to 100 nm. In one embodiment, the dielectric liner is composed of a thermally grown oxide.

In one embodiment, filling the first trench 15*a* and second trench 15*b* with a trench dielectric material 25 includes forming a portion of the trench dielectric material 25 atop the upper surface 30 of the semiconductor substrate 5 that is adjacent to the second trench 15*b*. In one embodiment, the trench dielectric material 25 is composed of a dielectric material, such as an oxide, polysilicon or a combination thereof. In one embodiment, the trench dielectric material 25 is deposited to fill the first trench 15*a* and the second trench 15*b* using chemical vapor deposition (CVD) or another like deposition process. The trench dielectric material 25 may optionally be densified after deposition.

In one embodiment, following filling the first trench 15*a* and the second trench 15*b* with the trench dielectric material 25, a planarization process may be used to provide a planar structure, in which the upper surface of the trench dielectric material 25 within the first trench 15*a* and the second trench 15*b* is coplanar with the first pad dielectric layer 10 of the pad stack 9.

Figure 15:
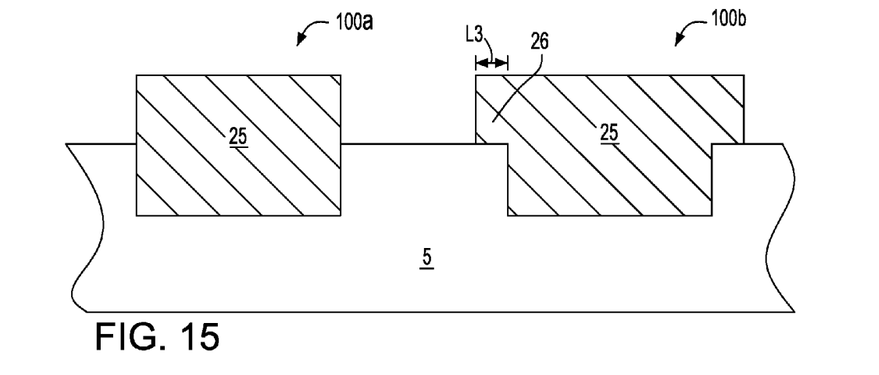
FIG. 15 is a side cross sectional view depicting one embodiment of removing the pad stack from the structure depicted in FIG. 14, in accordance with the present invention.

FIG. 15 is a side cross-sectional view depicting one embodiment of removing the pad stack 9 from the structure depicted in FIG. 14. In one example, the step of removing the pad stack 9 may include a selective etch process. In one embodiment, when the pad stack 9 includes a second pad dielectric 11 present between the first pad dielectric layer 10, and the semiconductor substrate 5, the step of removing of the first pad dielectric layer 10 includes a selective etch that removes the first pad dielectric layer 10 selective to the second pad dielectric layer 11, wherein in a following etch process the second pad dielectric layer 11 is removed selective to the semiconductor substrate 5.

The structure may then be processed to provide a microelectronic structure, in which each of the isolation regions 100*a*, 100*b* (first isolation region 100*a*, second isolation region 100*b*) provides for electrical isolation between adjacent devices, such as semiconductor devices, or components of electronic devices which require electrical isolation. In one embodiment, the portion 26 of the trench dielectric material 25 of the second isolation region 100b that is present on the exposed portion 30 of the upper surface of the semiconductor substrate 5, substantially reduces divot formation at the interface of the semiconductor substrate 5 and the trench dielectric material 25 within the trench 15. Typically, the portion 26 of the trench dielectric material 25 that is present atop the semiconductor substrate 5 has a length L3 that ranges from 1 nm to 70 nm, as measured from the sidewall S1 of the second trench 15b, wherein in one example the length L3 may range from 20 nm to 30 nm.

It is noted that using the above method, the second isolation region 100b including the portion 26 of the trench dielectric material 25 that is present on the upper surface of the semiconductor substrate 5, which substantially reduces divot formation, may be incorporated with a first isolation region 100a that does not include the portion of the trench dielectric material that extends atop the surface of the semiconductor substrate 5. In addition to the second isolation regions 100b, which includes the portion 26 of the trench dielectric material 25 that extends atop the semiconductor surface 5 that reduces divot formation, a first isolation region 100a can be incorporated onto the same semiconductor surface 5 that does not include the extension of the trench dielectric material 25 to reduce divot formation. The impact of the divot varies by device type but for all device types there is reduced performance since the corner device, i.e., the device closest to the divot, is distinct from the channel device by 50% change in the threshold voltage. In addition, divot formation typically reduces the gate oxide reliability, in which the gate oxide can be thinned by the wet etch steps that are used in the multi-oxide processes that result in divot formation. These same factors may impact all device types especially when multiple gate oxides are patterned in sequence. The embodiments consistent with FIGS. 9-15 allow for eliminating the effect of the divot by tailoring the amount of trench oxide that remains atop the substrate surface, e.g., silicon surface, depending on the specific device sensitivity. For example, by utilizing the present method, the processing for thin oxide pFETS may be selected to result in less divot formation than the processing for thin oxide nFETs devices. The number of devices which divot formation may be customized is set by the number of iterations of the above embodiment or the number of different bias compensation values on the photo mask used.

FIGS. 16-22 depict another aspect of the present invention, in which divot reduction during isolation region formation may be realized by a process in which a thermal oxide layer, i.e., first pad dielectric layer 75 (hereafter referred to as oxide pad dielectric layer), having a thickness on the order of 40 nm or greater, typically being greater than 50 nm, is formed prior to etch processes that define the active device regions 101 of the semiconductor substrate 5. The oxide pad dielectric layer 75 has a thickness suitable for integration into analog devices. In one one embodiment, the method may begin with providing a semiconductor substrate 5, and thermally growing an oxide pad dielectric layer 75 on the semiconductor substrate 5, wherein the oxide pad dielectric layer has a thickness greater than 40 nm. Thereafter, the oxide pad dielectric layer 75 is patterned to provide a via 80 to an exposed surface 85 of the semiconductor substrate 5 that is overlying at least a portion of the active device region 101 of the semiconductor substrate 5. A gate dielectric 90 is then formed on the exposed surface of the semiconductor substrate 5, in which a trench isolation region 100 is formed extending through the oxide pad dielectric layer 75 into a portion of the semiconductor substrate 5 that is abutting the active device region 101 of the semiconductor substrate 5.

Figure 16:
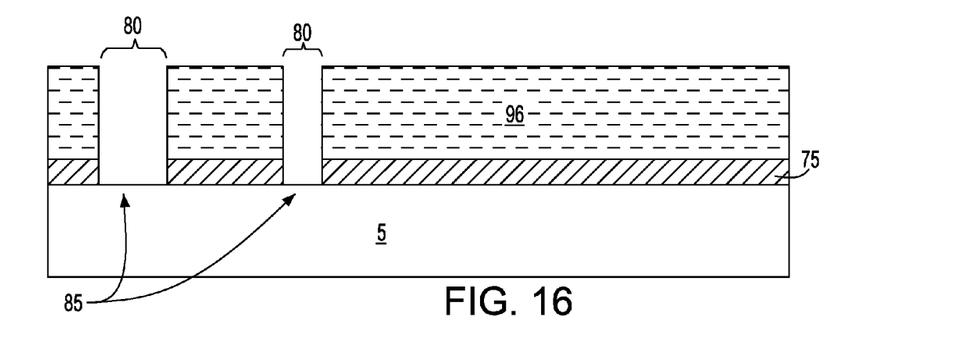
FIG. 16 is a side cross sectional view depicting one embodiment of an initial structure that may be used in a method to reduce divot formation in isolation region production, wherein in one embodiment initial process steps of the method may include thermally growing an oxide pad dielectric layer on a semiconductor substrate wherein the oxide pad dielectric layer has a thickness greater than 40 nm, and patterning the oxide pad dielectric layer to provide a via to an exposed surface of the semiconductor substrate that is overlying at least a portion of the active device region of the semiconductor substrate, as used in accordance with the present invention.

FIG. 16 depicts an initial structure that may be used in a method to reduce the incidence of divots during isolation region formation. The semiconductor substrate 5 that is described above in connection with the embodiments of the invention including the initial structure depicted in FIG. 1 is equally applicable to the semiconductor substrate 5 described in the embodiments of the invention that are illustrated in FIGS. 16-22.

FIG. 16 further illustrates the resultant structure that is produced by a process sequence that includes thermally growing an oxide pad dielectric layer 75 on the semiconductor substrate 5, wherein the oxide pad dielectric layer 75 has a thickness greater than 40 nm, typically being greater than 50 nm, and patterning the oxide pad dielectric layer 75 to provide a via 80 to an exposed surface 85 of the semiconductor substrate 5 that is overlying at least a portion of the active device region of the semiconductor substrate 5.

Although in the present example the first pad dielectric layer is a thermally grown oxide, i.e., oxide pad dielectric layer 75, the first pad dielectric layer may be any dielectric material, in which examples include, but are not limited to: silicon oxide and silicon oxynitride. In one embodiment, the oxide pad dielectric layer 75 has a thickness ranging from 40 nm to 100 nm, wherein in one example the oxide pad dielectric is greater than 55 nm. The oxide pad dielectric layer 75 is formed using a thermal growth process, such as thermal oxidation. In one embodiment, thermal oxidation of the semiconductor substrate 5 is conducted using an oxygen containing atmosphere at a temperature greater than 700° C., wherein in one example the oxidation temperature may be greater than 850° C.

Still referring to FIG. 16, in one embodiment, the step of the removing of the portion of the oxide pad dielectric layer 75 to provide the via 80 to the exposed surface 85 of the semiconductor substrate 5 that is overlying at least a portion of the active device region of the semiconductor substrate 5 includes forming a first etch mask 96 atop the oxide pad dielectric layer 75 that exposes a portion of the oxide pad dielectric layer 75 that is overlying the active device regions of the semiconductor substrate 5, and etching the portion of the exposed portion of the oxide pad dielectric layer 75 selective to the semiconductor substrate 5 to provide an exposed surface 85 of the semiconductor substrate 5.

In one embodiment, forming the first etch mask 96 includes depositing a photoresist layer atop the oxide pad dielectric layer 75 and patterning the photoresist layer. Following the formation of the first etch mask 96, the exposed portion of the oxide pad dielectric layer 75 is removed using a selective etch process that includes an etch chemistry that is selective to the semiconductor substrate 5. In one embodiment, in which the oxide pad dielectric layer 75 is composed of silicon oxide and the semiconductor substrate 5 is composed of silicon, the etch chemistry may include hydrofluoric acid or $CHF_3/Ar/O_2$.

Figure 17:
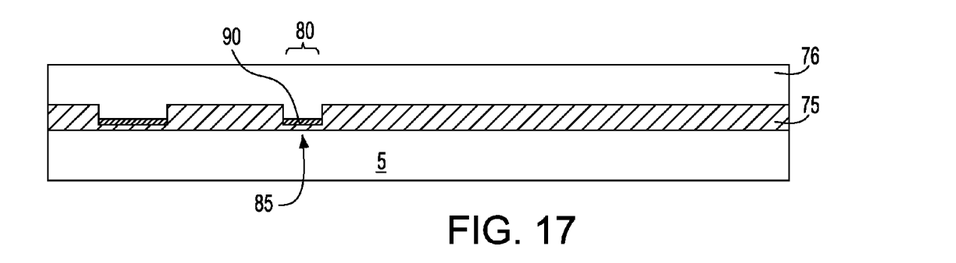
FIG. 17 is a side cross sectional view depicting one embodiment of forming a gate dielectric on the exposed surface of the semiconductor substrate, in accordance with the present invention.

FIG. 17 depicts one embodiment of forming of a gate dielectric 90 on the exposed surface 85 of the semiconductor substrate 5. In one example, forming the gate dielectric 90 includes a growth process, such as thermal growth, e.g., thermal oxidation. The gate dielectric 90 may have a thickness ranging from about 1 nm to about 10 nm, in some embodiments ranging from 2 nm to 5 nm, and in one example being 2.0 nm thick. In another example, the gate dielectric 90 may be formed using a deposition method, such as chemical vapor deposition.

Following the formation of the gate dielectric 90, a trench isolation region 100 may be formed through the oxide pad dielectric layer 75 into the semiconductor substrate 5 that is abutting the active device region 101. In one embodiment, the step of forming the trench isolation region 100 extending through the oxide pad dielectric layer 75 into the portion of the semiconductor substrate 5 that is abutting the active device region 101 of the semiconductor substrate 5 may begin with depositing a second pad dielectric layer 76 atop the oxide pad dielectric layer 75 and the gate dielectric 90 in the via 80. The second pad dielectric layer 76 is typically a nitride containing material, such as silicon nitride, and may have a thickness greater than 100 nm, e.g., being 120 nm thick. The second pad dielectric layer 76 may be deposited using chemical vapor deposition, including but not limited to: plasma enhanced chemical vapor deposition (PECVD) and high density plasma chemical vapor deposition (HDPCVD). Following deposition, the second pad dielectric layer 76 may be planarized via chemical mechanical polishing (CMP).

Figure 18:
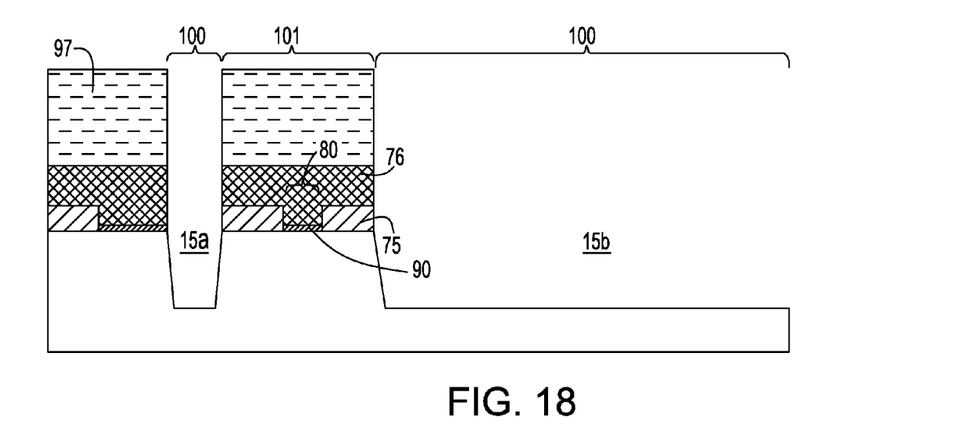
FIG. 18 is a side cross sectional view depicting forming a trench for a trench isolation region that is extending through the oxide pad dielectric into a portion of the semiconductor substrate that is abutting the active device region of the semiconductor substrate, in accordance with the present invention.

Referring to FIG. 18, in a following process step, a second etch mask 97 is formed atop the second pad dielectric layer 76 to provide an exposed portion of the second pad dielectric layer 76 overlying the portion of the semiconductor substrate 5 that is abutting the active device region 101 of the semiconductor substrate 5. The second etch mask 97 may be composed of the same materials and formed using the same methods as the first etch mask 96.

Trenches 15a, 15b may then be etched through the exposed portion of the second pad dielectric layer 76 through an underlying portion of the oxide pad dielectric layer 75 into a portion of the semiconductor substrate 5 that is abutting the active device region 101 of the semiconductor substrate 5. In one embodiment, the trenches 15a, 15b may be formed using an anisotropic etch process, such as reactive ion etch. In one embodiment, the etch chemistry that is selected to provide the trenches 15a, 15b is $CH_4$, $CHF_3/O_2$, $Ar/NF_3$.

Figure 19:
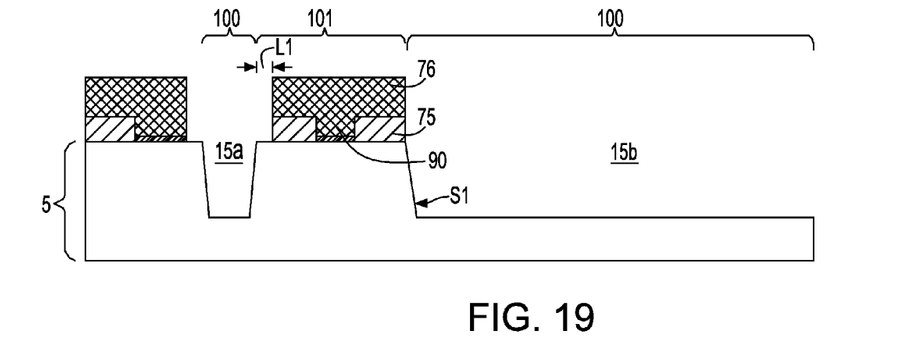
FIGS. 19-22 are side cross sectional views depicting filling the trench with a trench dielectric material and forming semiconductor devices, in accordance with the present invention.

Referring to FIG. 19, following the formation of the trenches 15a, 15b, the oxide pad dielectric layer 75 and second pad dielectric layer 76 are then laterally etched to expose an upper surface of the semiconductor substrate 5 adjacent the trenches 15a, 15b. The lateral etch process at this point of the method is similar to the embodiments of the invention that are described with reference to FIG. 2. In one embodiment, the step of laterally etching removes a portion of the oxide pad dielectric layers 75 and 76 that extends a dimension L1 ranging from 25 nm to 100 nm, as measured from a sidewall S1 of the trenches 15a, 15b. In one embodiment, the step of laterally etching the oxide pad dielectric layer 75 to expose the upper surface 20 of the semiconductor substrate 5 that is adjacent to the trench 15 includes a wet etch appropriate for dielectric etching, such as hot phosphoric acid and hydrofluoric acid.

Figure 20:
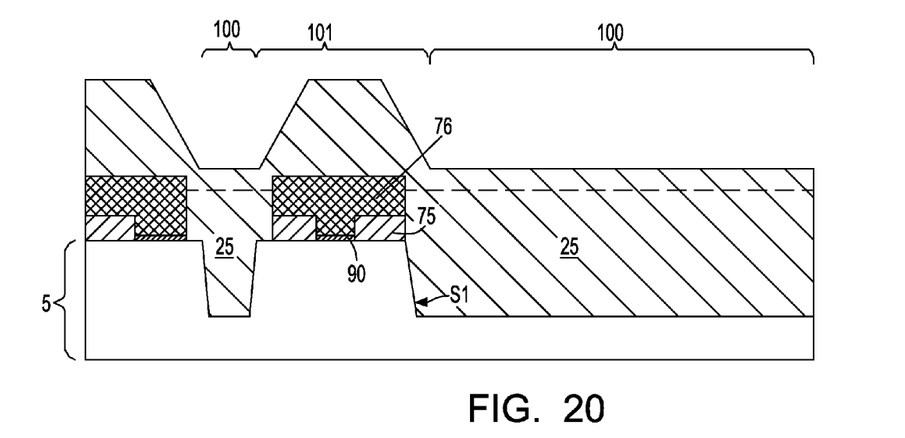

FIG. 20 depicts one embodiment of filling the trenches 15a, 15b with a trench dielectric material 25, wherein the trench dielectric material 25 extends atop the upper surface of the semiconductor substrate 5 adjacent the trench 15a, 15b and abutts the oxide pad dielectric layer 75. In one embodiment, the oxide pad dielectric 75 is composed of silicon oxide, the second pad dielectric layer is composed of a nitride, such as silicon nitride, and the trench dielectric material 25 comprises an oxide, such as silicon oxide.

Figure 21:
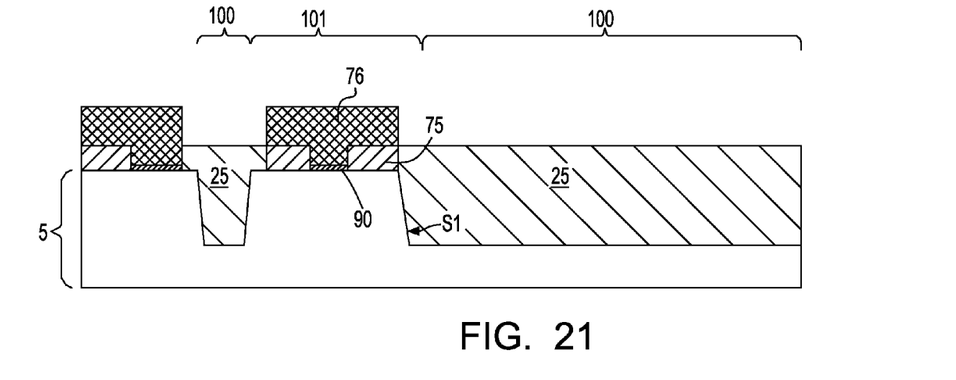
Figure 22:
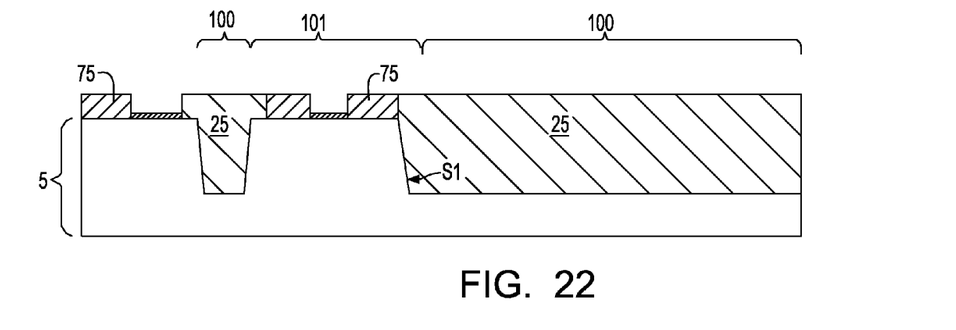

Referring to FIGS. 21 and 22, in one embodiment, following the step of filling the trenches 15a, 15b with the trench dielectric material 25, the trench dielectric material 25 is planarized to have an upper surface substantially coplanar with the upper surface of the second pad dielectric layer 76. In one example, the trench dielectric material 25 is planarized using chemical mechanical planarization (CMP). In one embodiment, following planarization the upper surface of the trench dielectric material is recessed below the upper surface of the second pad dielectric layer 76 using a selective etch process. Thereafter, second pad dielectric layer 76 may then be removed also using a selective etch process to expose the upper surface of the gate dielectric 90. In some embodiments, the method depicted in FIGS. 16-22 further includes the steps of implanting n-type or p-type dopants into the semiconducting substrate to provide source and drain regions abutting a device channel that is underlying the gate dielectric 90. During subsequent process steps a gate conductor is formed atop the gate dielectric 90 to provide a gate structure to a field effect transistor.

In one embodiment, the method disclosed in FIGS. 16-22 provides for mixed signal devices, i.e., analog and digital signal, on a singular semiconductor substrate. More specifically, the oxide pad dielectric layer 75 may provide the gate dielectric to analog devices, wherein the gate dielectric 90 that provides the site for the subsequent formation of the gate structrure of a field effect transistor may provide digital signal devices, such as CMOS applications. Further, the lateral etching of the oxide pad dielectric 75 prior to trench dielectric fill 75 substantially reduces divot formation. In one embodiment, an advantage of the present method is that by forming the oxide pad dielectric layer 75, e.g., thick gate oxide layer, before forming the trench dielectric material 25, the oxide pad dielectric layer 75 can be patterned without etching the trench dielectric material 25. If the trench dielectric material 25 is present during the etch of the oxide pad dielectric layer 75 then the trench dielectric material 25 will be simultaneously etched causing divots adjacent to trench 15a, 15b.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of forming an isolation region comprising:
    forming a first pad dielectric layer on an upper surface of a semiconductor substrate;
    forming a trench through the first pad dielectric layer into the semiconductor substrate;
    laterally etching the first pad dielectric layer to expose an upper surface of the semiconductor substrate adjacent the trench;
    filling the trench with a trench dielectric material, wherein the trench dielectric material extends atop the upper surface of the semiconductor substrate adjacent the trench and abuts the pad dielectric layer;
    removing the first pad dielectric layer to provide an exposed portion of the upper surface of the semiconductor substrate that is adjacent the trench dielectric material that extends atop the upper surface of the semiconductor substrate that is adjacent to the trench; and
    forming a conformal dielectric layer overlying the exposed portion of the semiconductor substrate and the trench dielectric material.

2. The method of claim 1, wherein the first pad dielectric layer is composed of a nitride material.

3. The method of claim 2 further comprising a second pad dielectric layer composed of an oxide material present between the first pad dielectric layer and the semiconductor substrate.

4. The method of claim 1, wherein the trench dielectric material that is present in the trench and extends atop the upper surface of the semiconductor substrate that is adjacent to the trench is an oxide.

5. The method of claim 1 further comprising forming a dielectric liner on the upper surface of the semiconductor substrate that is adjacent to the trench prior to filling the trench with the trench dielectric material.

6. The method of claim 5, wherein the dielectric liner is composed of a thermally grown oxide.

7. The method of claim 1, wherein the laterally etching of the dielectric layer to expose the upper surface of the semiconductor substrate that is adjacent to the trench comprises a wet etch composed of hot phosphoric acid and hydrofluoric acid.

8. The method of claim 1, wherein the laterally etching removes a portion of the first pad dielectric layer that extends a dimension ranging from 10 nm to 70 nm as measured from a sidewall of the trench.

9. The method of claim 1, wherein the filling of the trench with the trench dielectric material includes high density plasma chemical vapor deposition followed by chemical mechanical planarization.

10. The method of claim 9, wherein following the filling of the trench with the trench dielectric material an upper surface of the trench dielectric material is treated with a etch process that comprises a hydrofluoric acid composition.

* * * * *